US009070565B2

(12) United States Patent
Bouisse

(10) Patent No.: US 9,070,565 B2
(45) Date of Patent: Jun. 30, 2015

(54) POWER RF AMPLIFIERS

(71) Applicant: NXP B.V., Eindhoven (NL)

(72) Inventor: Gerard Jean-Louis Bouisse, Toulouse (FR)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 14/054,705

(22) Filed: Oct. 15, 2013

(65) Prior Publication Data

US 2014/0103447 A1    Apr. 17, 2014

(30) Foreign Application Priority Data

Oct. 17, 2012    (EP) .................................... 12290353

(51) Int. Cl.
| | |
|---|---|
| H01L 29/76 | (2006.01) |
| H01L 29/94 | (2006.01) |
| H01L 31/113 | (2006.01) |
| H01L 31/119 | (2006.01) |
| H01L 27/06 | (2006.01) |
| H01L 23/64 | (2006.01) |
| H01L 23/66 | (2006.01) |
| H01L 23/00 | (2006.01) |

(52) U.S. Cl.
CPC .......... *H01L 27/0641* (2013.01); *H01L 23/645* (2013.01); *H01L 23/66* (2013.01); *H01L 24/49* (2013.01); *H01L 2223/6611* (2013.01); *H01L 2223/6644* (2013.01); *H01L 2223/6655* (2013.01)

(58) Field of Classification Search
CPC ............ H01L 27/1112; H01L 27/0629; H01L 29/7395; H01L 31/113; H01L 31/119
USPC ................................ 257/379, E21.4; 330/253
See application file for complete search history.

(56) References Cited

U.S. PATENT DOCUMENTS

| | | | | |
|---|---|---|---|---|
| 5,289,142 | A  * | 2/1994 | Upton ........................... | 333/103 |
| 2009/0174482 | A1 | 7/2009 | Blednov | |
| 2009/0322427 | A1 | 12/2009 | Degani et al. | |
| 2012/0038421 | A1* | 2/2012 | Bouisse ........................ | 330/253 |
| 2013/0049814 | A1* | 2/2013 | De Rooij et al. .............. | 327/108 |

OTHER PUBLICATIONS

Extended European Search Report for Patent Appln. No. 12290353.7 (Apr. 16, 2013).

* cited by examiner

*Primary Examiner* — Phuc Dang

(57) ABSTRACT

A power transistor circuit uses first and second power transistors in differential mode. An inductor arrangement of inductors is formed by wire bonds between the drains. The transistors are in a mirrored configuration, and the inductor arrangement comprises wire bonds which extend between the drain connections across the space between the mirrored transistors.

8 Claims, 4 Drawing Sheets

POWER RF AMPLIFIERS

CROSS-REFERENCE TO RELATED APPLICATIONS

This application claims the priority under 35 U.S.C. §119 of European patent application no. 12290353.7, filed on Oct. 17, 2012, the contents of which are incorporated by reference herein.

This invention relates to RF power amplifiers.

RF power amplifiers are packaged with impedance matching circuitry to enable the amplifier to be used in practical circuits. In particular, RF power amplifiers have very low impedance, so components within the transistor package are used for pre-matching.

FIG. 1 shows an example of the matching components that can be used within an RF power amplifier package. The transistor is represented by unit 10, and the source S, drain D and gate G are shown. The capacitor 12 is the intrinsic drain-source capacitance.

An input matching network is provided between an input pad 14 and the gate G, and comprises two series inductors 16,18, with their midpoint coupled to ground by an input capacitor 20.

An output matching network is added to the package connected to the drain. This comprises a series inductor 22, and a shunt branch of a shunt capacitor 24 and inductor 26 in series. The inductor 26 can be formed by wire bonds. The capacitor 24 functions as DC block and RF short, and for example has a capacitance of 200 pF. The series output inductor 22 is also formed in series by wire bonds to an output pad 28. There are also lead capacitances not shown in the circuit.

This arrangement uses a shunt inductor 26 to provide the required output impedance matching.

FIG. 2 shows in the top plot the baseband input impedance seen by the current source of an LDMOS transistor in a conventional single stage power amplifier, as a function of frequency. This impedance represents the baseband load in the drain plane of the transistor, and shows that the circuit behaves as an open circuit at 160 MHz. There is a 180 degree phase shift at this frequency as shown in the lower plot.

The video bandwidth, or instantaneous bandwidth, represents the ability for an RF power amplifier to amplify instantaneously a linear signal without asymmetrical distortion. This means that for a pair of input signals spaced by a certain frequency, the upper and lower intermodulation components have the same amplitude. At a certain point, the frequency difference between the input signals becomes too large for the intermodulation components to remain symmetrical, and this presents a limit to the frequency range over which the amplifier performance can be made linear.

The video bandwidth is thus related to the broadest modulating signal that can be handled instantaneously by the RF power amplifier without asymmetrical distortion.

It has been recognized that the video bandwidth is closely related to the embedded capacitance of the matching circuit.

The shunt inductor circuit of FIG. 1 has a high total capacitance. The capacitor 24 is typically 5 to 10 times the intrinsic drain source capacitance of the transistor (capacitor 12), making the total circuit capacitance 6 to 11 times the intrinsic drain source capacitance.

US 2012/0038421 discloses an arrangement which uses a similar shunt inductor arrangement but in a differential topology. By having a virtual earth between the pair of differential amplifier transistors, the shunt capacitor can be omitted. This enables the circuit for each transistor to have an effective embedded capacitance equal to the intrinsic drain-source capacitance.

FIG. 3 shows in schematic form the arrangement used. As the circuit is a differential circuit, there are two transistors 10a, 10b connected at their sources S to a virtual earth. They each have an intrinsic source drain capacitance (not shown). The input matching circuit is not shown, since the modification resides in the output side.

The shunt inductors 26a, 26b also connect together at a virtual earth, and there is no need for a series capacitor in the shunt path.

FIG. 4 shows in the top plot the impedance corresponding to that shown in FIG. 2 as a function of frequency, and shows that the circuit behaves as an open circuit at 1.3 GHz. This means the video bandwidth performance is greatly improved as the non-linear performance has been pushed up in frequency.

The circuit of US2012/0038421 works well up to a power limit. As the power of the transistor increases, the dimensions increase. The associated larger capacitances mean that lower values of inductance are needed to obtain the desired circuit resonance. The need for the inductances to be distributed evenly across a multiple finger transistor structure makes the desired inductance values difficult to achieve, for example with the microstrip line as used in US 2012/0038421. In practice, this imposes a power limit, for example of around 100 W.

There is a need for a matching circuit topology which enables scaling to larger power while meeting desired video bandwidth performance.

According to the invention, there is provided a circuit as claimed in claim 1.

According to an aspect, there is provided a power transistor circuit, comprising:

first and second power transistors, which each occupy an elongate rectangular area with gate connections on a gate side and drain connections on the opposite drain side, wherein the drain connections of each transistor connect to a respective output pad enabling use of the two power transistors in a differential amplifier configuration; and an inductor arrangement of inductors formed by wire bonds between the drain connections, wherein an elongate side of one transistor faces an elongate side of the other in a mirrored arrangement, and the inductor arrangement comprises wire bonds which extend between the drain connections across the space between the transistors.

This arrangement provides shunt inductances between differential amplifier outputs, which avoids the need for shunt capacitances, and thereby improves the video bandwidth. The inductors form an output impedance matching circuit. Only the active device output capacitance remains part of the amplifier circuit. By opposing the transistors in the mirror arrangement, the design can be scaled to larger powers. For example the transistor size can be increased without resulting in a corresponding increase in the length of the wire bonds used to define the differential shunt inductors.

The transistors can have their gate sides facing each other, so that an input side matching circuit can be between the transistors.

A separate input pad is preferably provided, one for each gate side. Thus, the two transistors can be operated with differential input and output.

The circuit can comprise a package having a quadrilateral shape, wherein two input pads are provided at one side of the quadrilateral package, and the output pads are provided at the two adjacent sides. This design means the circuit can be scaled by extending the elongate direction.

The wire bond inductances of the output matching circuit can be tuned based on the number of wire bonds, their height and their diameters.

Integrated circuit inductor tracks can also be provided between the input pads and the gates. These are used to define an input impedance matching circuit.

Each transistor elongate rectangular area provides at least 100 mm of total gate periphery. Each transistor is arranged as a set of parallel fingers. The inductor arrangement wire bonds can for example be provided every 5 to 10 fingers.

A connection line can be provided connecting the mid points of the inductor wire bonds. This enables a connection to be made to provide external baseband decoupling, to provide further improved video bandwidth performance.

The circuit can for example be used as a power amplifier of output power greater than 100 W, for example greater than 200 W.

Examples of the invention will now be described in detail with reference to the accompanying drawings, in which.

The invention provides a power transistor circuit which uses first and second power transistors in differential mode. An inductor arrangement of inductors is formed by wire bonds between the drains. The transistors are in a mirrored configuration, and the inductor arrangement comprises wire bonds which extend between the drain connections across the space between the mirrored transistors.

The invention in part relates to the topology of the transistors of a power transistor circuit.

Figure 1:
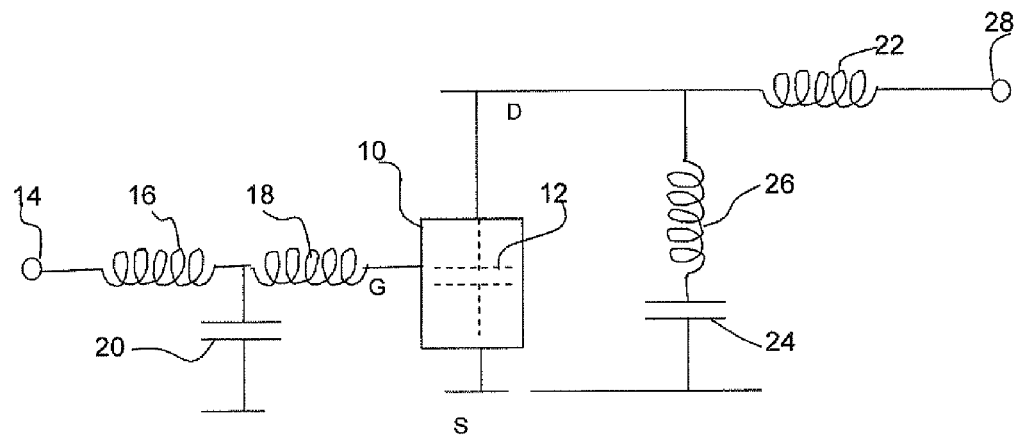
FIG. 1 shows a first known matching circuit for use with a power RF amplifier transistor.
Figure 2:
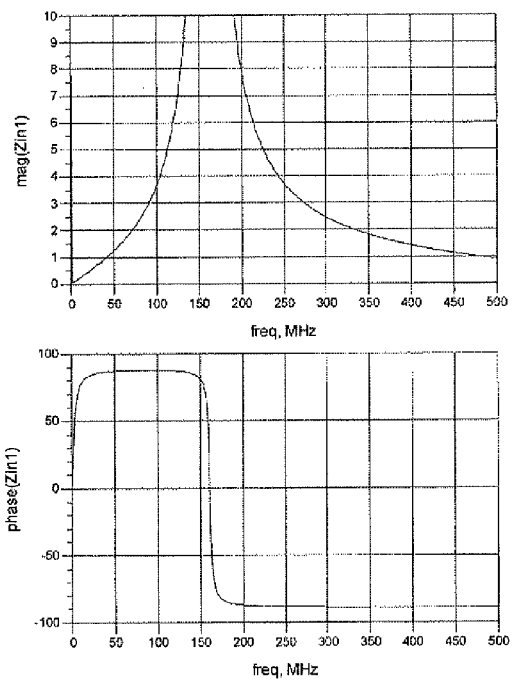
FIG. 2 shows the performance of the circuit of FIG. 1.
Figure 3:
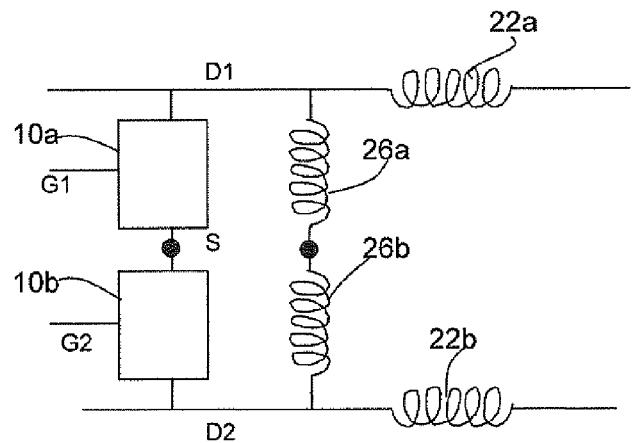
FIG. 3 shows a second known matching circuit for use with a power RF amplifier transistor.
Figure 4:
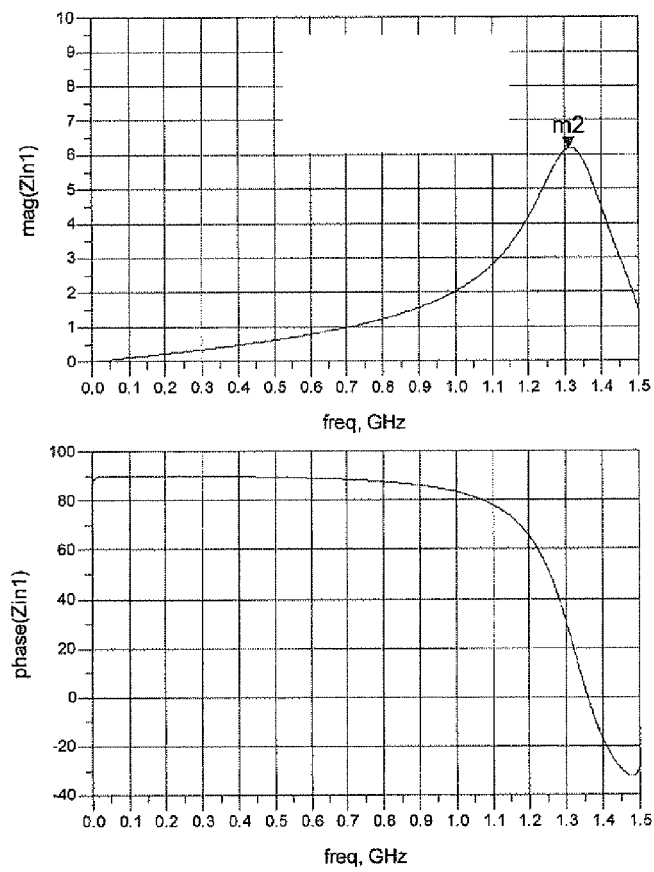
FIG. 4 shows the performance of the circuit of FIG. 3.
Figure 5:
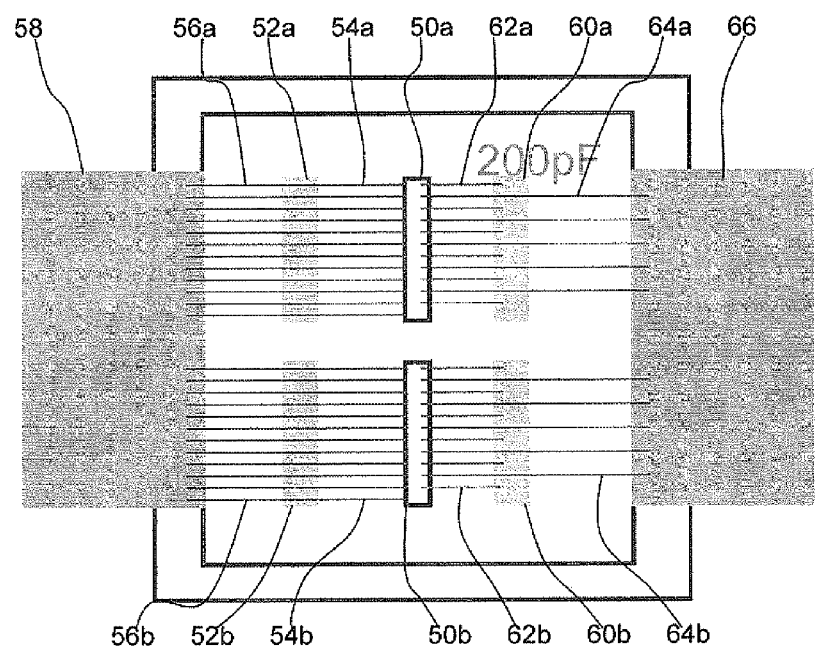
FIG. 5 shows a first known transistor topology.

FIG. 5 shows a known topology to form the circuit of FIG. 1. Two transistor circuits are shown with coupled input and outputs. Two (or more) transistors are typically used to enable suitable power levels to be obtained based on repetition of individual lower power blocks.

Two transistors 50a, 50b are provided. They each have an elongate rectangular footprint, and typically comprise an array of channels. The two elongate rectangular footprints are aligned along a common axis, i.e. the smaller ends face each other. The gate connections are to the left, and these connect to an input capacitor 52a, 52b using wire bonds 54a, 54b which define a first serial impedance. This corresponds to the inductor 18 and capacitor 20 in FIG. 1, with the capacitor being a shunt capacitor to ground.

Further wire bonds 56a, 56b connect to the input terminal 58. These wire bonds correspond to the inductor 16 in FIG. 1, and the terminal 58 defines the input pad 14 of FIG. 1.

Thus, these inductors and capacitors define the passive input matching network shown in FIG. 1.

The drain connections are to the right and these connect to the shunt capacitors 60a, 60b (corresponding to capacitor 24 in FIG. 1) by wire bonds 62a, 62b which define the shunt inductors (corresponding to inductor 26 in FIG. 1). Further wire bonds 64a, 64b connect to the output terminal 66 and correspond to the inductor 22 of FIG. 1, and the terminal 66 defines the output pad 28 of FIG. 1.

Figure 6:
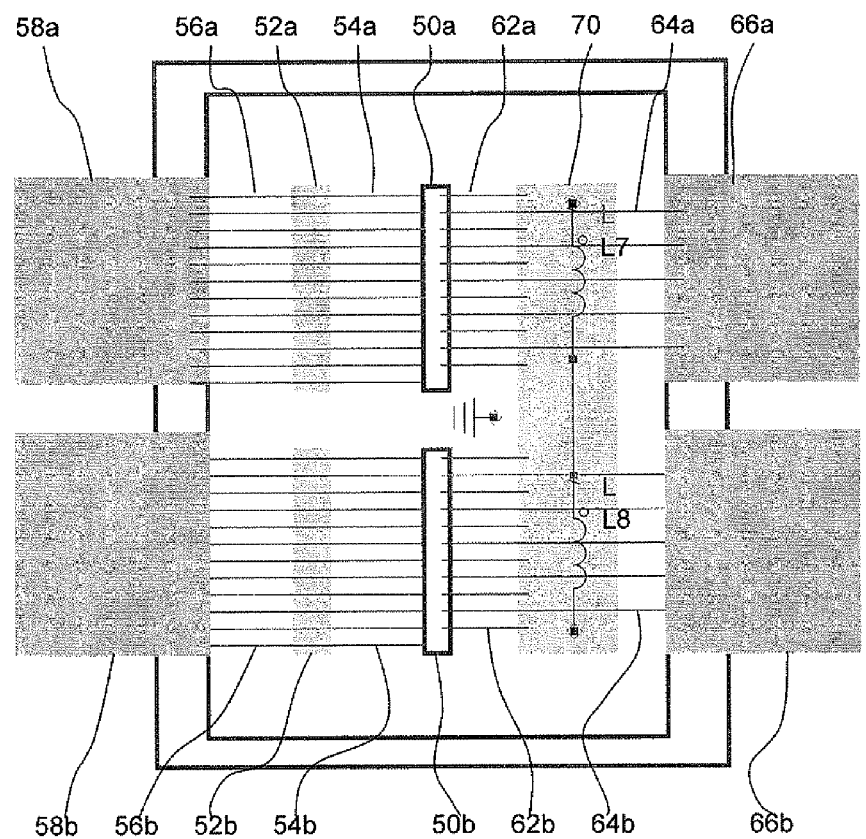
FIG. 6 shows a second known transistor topology.

To reduce the capacitances in the circuit, the shunt capacitors can be removed by using a differential configuration as explained above. As shown in FIG. 6, two separate input terminals 58a,58b and output terminals 66a,66b are thus needed. The same components are given the same references. The outputs are coupled together by a further inductor 70 so that there is a series connection of inductors between the outputs (defined by bondwires 62a, 62b and microstrip inductor 70). This configuration corresponds to that described in US 2012/0038421.

A problem with this layout is that the inductances are difficult to control when the design is scaled to increase the power capability.

Figure 7:
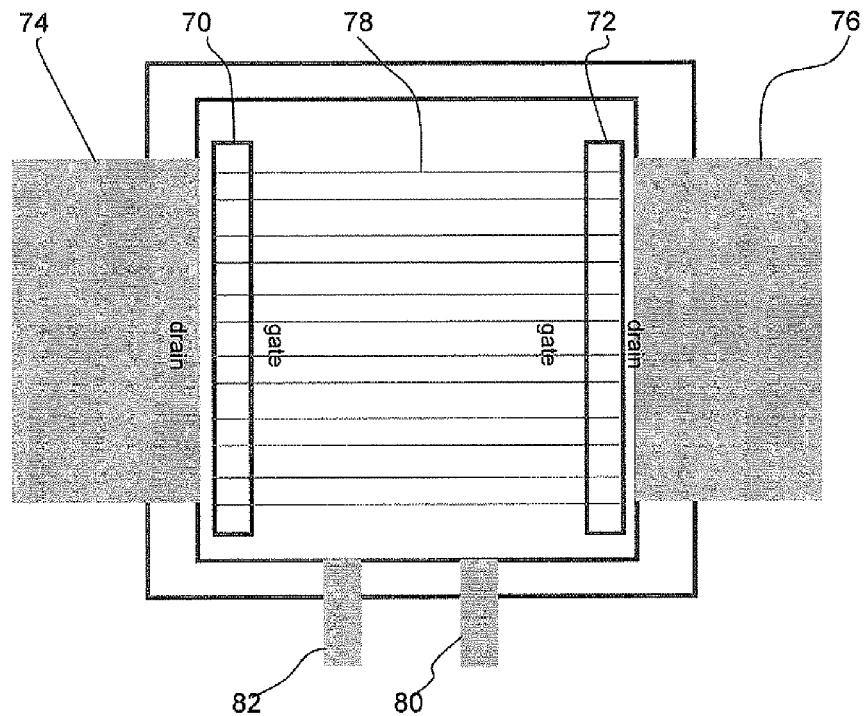
FIG. 7 shows a first example of transistor circuit of the invention.

FIG. 7 shows in schematic form a first example of design in accordance with the invention, focusing on the output impedance matching circuit.

The circuit has first and second power transistors 70,72, which each occupy an elongate rectangular area with gate connections on a gate side (which is one elongate side) and drain connections on the opposite drain side. The drain connections of each transistor connect to a respective output pad 74,76 enabling use of the two power transistors in a differential amplifier configuration. The output pads function as the differential output.

The transistor areas are formed as a set of parallel fingers. The individual transistor areas can for example have width of the order of hundreds of microns corresponding to the gate width contributed by each finger (such as 750 μm) and a height of the order of mm (for example 5 mm). The number of fingers determines the overall gate periphery which may for example be greater than 100 mm.

The differential shunt inductor arrangement is formed by wire bonds 78 between the drain connections.

The elongate side of one transistor faces an elongate side of the other in a mirrored arrangement, and the wire bonds extend between the drain connections across the space between the transistors. The inductor arrangement of the output matching circuit is formed only by the wire bonds.

In the example shown, the gate sides face each other.

A separate input pad 80,82 is provided for each gate side and functioning as the differential input terminals.

The overall package is a quadrilateral with the two input pads at one face of the quadrilateral package (the bottom in FIG. 7), and the output pads are provided at the two adjacent sides (the left and right in FIG. 7).

The inductors shown function as the output matching circuit. FIG. 7 does not show the input matching circuit. However, input matching can also be provided, for example formed as integrated circuit components using conventional matching topologies. Differential mode input impedance matching can be provided. Integrated circuit inductor tracks can for example be formed which connect to the transistor gates to define the input impedance matching circuit components shown in FIG. 1, or indeed other input matching circuits may be implemented.

In the example of FIG. 7, each wire bond extends fully between the drain sides of the two transistors, and only the set of wire bonds is used to form the inductance of the output matching circuit. Instead, each connection between the transistor drains can comprise multiple wire bonds in series.

Figure 8:
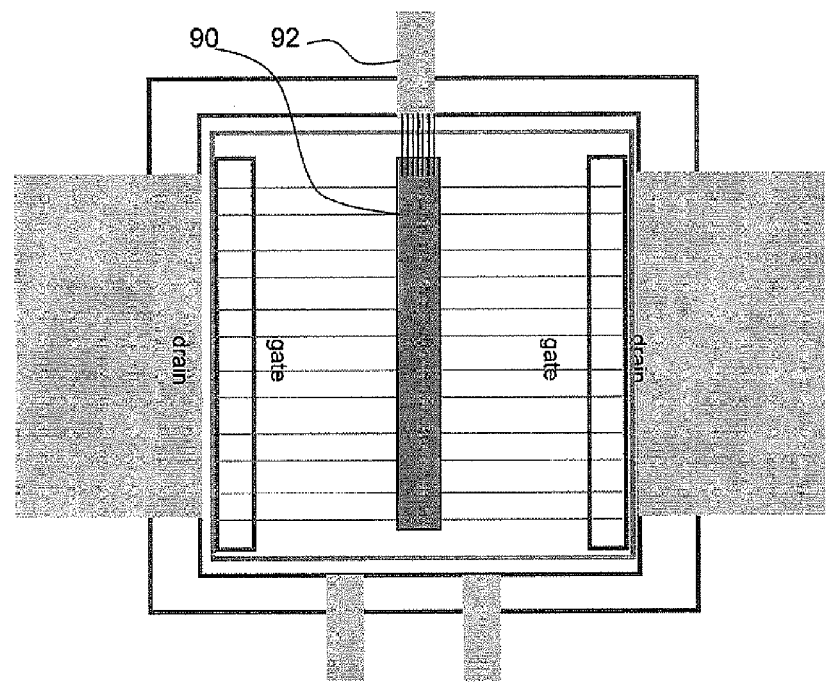
FIG. 8 shows a second example of transistor circuit of the invention.

For example, FIG. 8 shows a modification in which a transmission line 90 connects the midpoints of the shunt inductor lines. This transmission line can be implemented as an additional bond pad to which a pair of inductor wire bonds connect, wherein each pair together defines the wire bond inductance between the transistor drains. An extra dc output pin 92 enables external baseband decoupling.

This allows improved video bandwidth performance, and also allows dc feeding from the PCB to the transistor without the need for quarter wave transmission lines.

The invention is of interest for power amplifiers. These typically have individual transistor areas with a total gate periphery of at least 100 mm, with a series of parallel fingers defining separate parallel transistor channels. The wire bond inductors can connect to a subset of drain lines, for example with wire bonds provided every 5 to 10 fingers.

To scale the power transistor circuit, the whole circuit can simply be scaled (or duplicated) in the elongate axis direction. The scaling results in increased capacitances, which then require reduced inductances to provide the same resonant frequencies. The scaling or duplication of the parallel wire bond inductors provides this reduction in inductance without any required change in topology. Thus, the topology can be scaled while maintaining the desired electrical characteristics.

By way of example, there may be 0.75 mm finger width (as mentioned above), so 200 transistor fingers to achieve a total gate periphery of 150 mm, and 20 to 40 shunt inductor wire bond lines. Each wire bond can provide a desired inductance based on its diameter and length. For a given spacing between the transistors, the wire bond length may be selectable within limits by allowing different wire bond height.

The invention enables an increase in power, while maintaining the desired video bandwidth. For example the power amplifier can have output power greater than 100 W, for example 200 W or even 300 W. This makes the amplifier suitable for use in telecommunications base stations for example, or other high power application.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. Any reference signs in the claims should not be construed as limiting the scope.

The invention claimed is:

1. A power transistor physical circuit layout, comprising:
   first and second power transistors, each having an elongate rectangular area with gate connections on a gate side of the elongate area and drain connections on an opposite drain side of the elongate area,
   wherein the drain connections of each transistor connect to a respective output pad enabling use of the two power transistors in a differential amplifier configuration; and
   an inductor arrangement of inductors formed by wire bonds between the drain connections,
   wherein the gate side of the first transistor faces the gate side of the second transistor in a mirrored arrangement, and the inductor arrangement comprises wire bonds which extend between the drain connections across the gate sides of the first and second power transistors.

2. A circuit as claimed in claim 1, comprising a separate input pad, one for each gate side.

3. A circuit as claimed in claim 1, comprising a package having a quadrilateral shape, wherein two input pads are provided at one side of the quadrilateral package, and the output pads are provided at the two adjacent sides.

4. A circuit as claimed in claim 1, comprising inductor tracks between the input pads and the gates.

5. A circuit as claimed in claim 1, wherein each transistor provides a total gate periphery of at least 100 mm, with a series of parallel fingers.

6. A circuit as claimed in claim 5, wherein the inductor arrangement wire bonds are provided every 5 to 10 fingers.

7. A circuit as claimed in claim 1, further comprising a connection line connecting the mid points of the inductor wire bonds.

8. A circuit as claimed in claim 1, comprising a power amplifier of output power greater than 100 W.

\* \* \* \* \*